United States Patent
Shim et al.

(10) Patent No.: US 11,509,851 B2
(45) Date of Patent: Nov. 22, 2022

(54) IMAGE SENSOR

(71) Applicant: SAMSUNG ELECTRONICS CO., LTD., Suwon-si (KR)

(72) Inventors: Heesung Shim, Seoul (KR); Sangyoon Kim, Yongin-si (KR); Joosung Moon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/396,320

(22) Filed: Aug. 6, 2021

(65) Prior Publication Data
US 2022/0070400 A1 Mar. 3, 2022

(30) Foreign Application Priority Data
Aug. 27, 2020 (KR) .................. 10-2020-0108541

(51) Int. Cl.
| | |
|---|---|
| *H04N 5/378* | (2011.01) |
| *H04N 5/355* | (2011.01) |
| *H04N 5/374* | (2011.01) |
| *H01L 27/146* | (2006.01) |
| *H04N 5/3745* | (2011.01) |
| *H01L 27/148* | (2006.01) |

(52) U.S. Cl.
CPC ....... *H04N 5/378* (2013.01); *H01L 27/14612* (2013.01); *H01L 27/14636* (2013.01); *H01L 27/14643* (2013.01); *H01L 27/14831* (2013.01); *H04N 5/3559* (2013.01); *H04N 5/37455* (2013.01)

(58) Field of Classification Search
CPC .. H04N 5/378; H04N 5/3559; H04N 5/37455; H04N 5/353; H04N 5/3532; H04N 5/3575; H04N 5/3696; H04N 5/37452; H01L 27/14612; H01L 27/14636; H01L 27/14643
See application file for complete search history.

(56) References Cited

U.S. PATENT DOCUMENTS

| | | |
|---|---|---|
| 9,100,605 B2 | 8/2015 | Raynor |
| 9,641,783 B2 | 5/2017 | Funaki |
| 9,654,712 B2 | 5/2017 | Hong |

(Continued)

FOREIGN PATENT DOCUMENTS

JP 2019-213174 A 12/2019

*Primary Examiner* — Marly S Camargo
(74) *Attorney, Agent, or Firm* — Sughrue Mion, PLLC

(57) ABSTRACT

An image sensor is provided. The image sensor includes a pixel array in which a plurality of pixels are arranged, wherein each of the plurality of pixels includes a photodiode; a floating diffusion node configured to integrate photocharges generated in the photodiode; a first sampling transistor electrically connected to a first node; a first capacitor electrically connected to a first node and configured to store a charge corresponding to a voltage of the floating diffusion node which is reset; a second sampling transistor electrically connected to a second node; a second capacitor electrically connected to the second node and configured to store a charge corresponding to a voltage of the floating diffusion node in which the photocharges are integrated; and at least one mode transistor configured to adjust an equivalent capacitance of each of the first node and the second node according to a mode control signal.

20 Claims, 11 Drawing Sheets

(56) References Cited

U.S. PATENT DOCUMENTS

| | | |
|---|---|---|
| 9,843,748 B2 | 12/2017 | Funaki |
| 10,021,334 B2 | 7/2018 | Stark |
| 10,038,869 B2 | 7/2018 | Raynor |
| 10,250,832 B1* | 4/2019 | Xu .................. H04N 5/3745 |
| 10,277,856 B2 | 4/2019 | Okura et al. |
| 10,535,695 B2 | 1/2020 | Raynor |
| 2014/0008520 A1* | 1/2014 | Raynor .................. H04N 5/378 |
| | | 250/208.1 |
| 2017/0026595 A1* | 1/2017 | Chenebaux ............ H04N 5/363 |
| 2017/0363764 A1* | 12/2017 | Innocent ................ H04N 5/353 |
| 2019/0222783 A1 | 7/2019 | Nishihara et al. |
| 2019/0288023 A1* | 9/2019 | Raynor .................. H04N 5/363 |
| 2021/0400214 A1* | 12/2021 | Shim .................... H04N 5/3559 |
| 2022/0094864 A1* | 3/2022 | Lee ...................... H04N 5/3535 |

* cited by examiner

IMAGE SENSOR

CROSS-REFERENCE TO RELATED APPLICATION

This application is based on and claims priority under 35 U.S.C. § 119 to Korean Patent Application No. 10-2020-0108541, filed on Aug. 27, 2020, in the Korean Intellectual Property Office, the disclosure of which is incorporated by reference herein in its entirety.

BACKGROUND

Example embodiments of the disclosure relate to an image sensor, and more particularly, to an image sensor capable of supporting driving of a global shutter method.

An image sensor that captures images and converts the captured images into electrical signals is widely used such as in consumer electronic devices such as digital cameras, mobile phone cameras, and portable camcorders, as well as cameras installed in vehicles, security devices, and robots.

The image sensor may determine an amount of photocharges which is a basis of an electrical signal, by adjusting an exposure time. The image sensor may adjust the exposure time using a rolling shutter method and a global shutter method. The rolling shutter method controls an integration time of photocharges to be different for each row of a pixel array, and the global shutter method controls the integration time of photocharges to be equal with respect to each row of the pixel array.

SUMMARY

One or more example embodiments provide an image sensor that generates an image without distortion by controlling a photocharge integration time of pixels.

According to an aspect of an example embodiment, there is provided an image sensor including a pixel array in which a plurality of pixels are arranged, wherein each pixel of the plurality of pixels includes a photodiode; a floating diffusion node configured to integrate photocharges generated in the photodiode; a first sampling transistor electrically connected to a first node; a first capacitor electrically connected to the first node and configured to store a charge corresponding to a voltage of the floating diffusion node which is reset; a second sampling transistor electrically connected to a second node; a second capacitor electrically connected to the second node and configured to store a charge corresponding to a voltage of the floating diffusion node in which the photocharges are integrated; and at least one mode transistor configured to adjust an equivalent capacitance of each of the first node and the second node according to a mode control signal.

According to an aspect of an example embodiment, there is provided an image sensor including a pixel array in which a plurality of pixels are arranged, wherein each pixel of the plurality of pixels includes a photodiode; a floating diffusion node configured to integrate photocharges generated in the photodiode; a first reset transistor configured to reset the floating diffusion node to a pixel voltage; a first source follower transistor configured to amplify a potential change of the floating diffusion node and output the amplified potential change to an output node; a first sampling transistor electrically connected between the output node and a first node; a second sampling transistor electrically connected between the output node and a second node, the second node being different from the first node; a first capacitor electri-cally connected between the first node and the third node; a second capacitor electrically connected between the second node and the third node; and at least one mode transistor configured to provide the pixel voltage to a first terminal of the first capacitor and a first terminal of the second capacitor based on a mode control signal.

According to an aspect of an example embodiment, there is provided an image sensor including a pixel array in which a plurality of pixels are arranged, wherein each pixel of the plurality of pixels includes a photodiode; a transfer transistor configured to transmit photocharges generated in the photodiode to a floating diffusion node; a reset transistor configured to reset the floating diffusion node to a pixel voltage; a first source follower transistor configured to amplify a potential change of the floating diffusion node and output the amplified potential change to an output node; a precharge transistor configured to precharge the output node; a first sampling transistor electrically connected between the output node and a first node; a second sampling transistor electrically connected between the output node and a second node, the second node being different from the first node; a first capacitor electrically connected between the first node and a third node; a second capacitor electrically connected between the second node and the third node; a mode transistor configured to apply the pixel voltage to the third node according to a switching operation; a second source follower transistor configured to amplify and output a potential change of the first node; a first selection transistor electrically connected to the second source follower transistor and configured to output a first pixel signal to a first column line; a third source follower transistor configured to amplify and output a potential change of the second node; and a second selection transistor electrically connected to the third source follower transistor and configured to output a second pixel signal to a second column line.

BRIEF DESCRIPTION OF THE DRAWINGS

The above and/or other aspects will be more apparent by describing certain example embodiments with reference to the accompanying drawings, in which.

DETAILED DESCRIPTION

Hereinafter, example embodiments of the will be described in detail with reference to the accompanying drawings.

Figure 1:
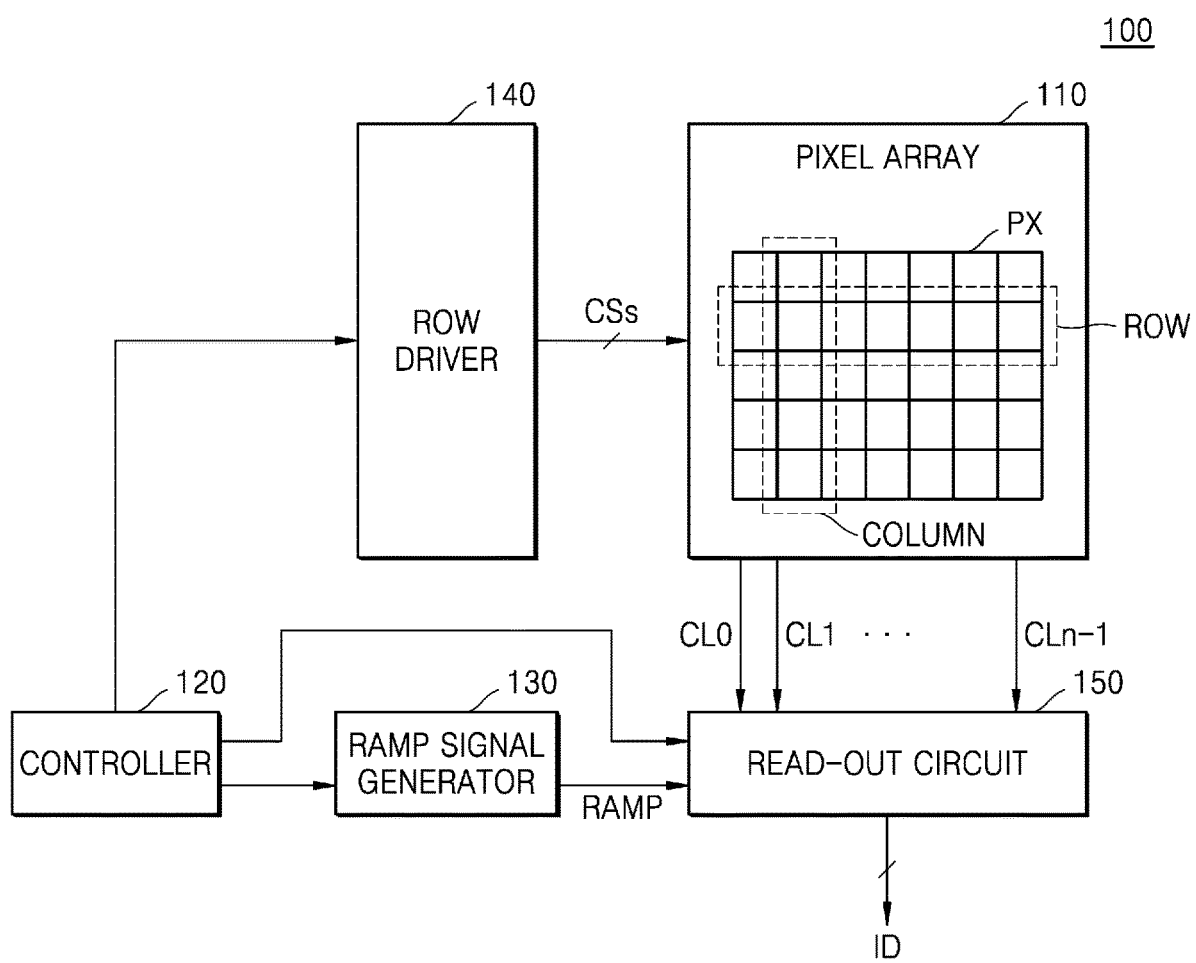
FIG. 1 is a block diagram illustrating a configuration of an image sensor according to an example embodiment.

FIG. 1 is a block diagram illustrating a configuration of an image sensor 100 according to an example embodiment.

An image processing system may include the image sensor 100 and a digital signal processor (DSP). Each of the image sensor 100 and the DSP may be implemented as a chip, or the image sensor 100 and the DSP may be implemented as one image sensor chip. The DSP may perform signal processing based on image data ID. For example, the DSP may perform noise reduction processing, gain adjustment, waveform shaping processing, interpolation processing, white balance processing, gamma processing, edge enhancement processing, and the like.

Referring to FIG. 1, the image sensor 100 may include a pixel array 110, a controller 120, a ramp signal generator 130, a row driver 140, and a read-out circuit 150. For example, the read-out circuit 150 may include a correlated-double sampling (CDS) circuit, an analog-digital converter, and a buffer.

The pixel array 110 may include a plurality of pixels PX. Each of the plurality of pixels PX may include a photoelectric conversion element, and may generate pixel signals corresponding to an object by converting light detected by the photoelectric conversion element into an electrical signal. Each of the plurality of pixels PX may output the pixel signals to the read-out circuit 150 through corresponding first to nth column lines CL0 to CLn-1.

In the pixel array 110, the plurality of pixels PX may be arranged in the form of a matrix arranged in a plurality of rows and a plurality of columns. The plurality of pixels PX may be an active pixel sensor (APS).

In an example embodiment, each of the plurality of pixels PX may include one of a red filter that allows light in a red wavelength region to transmit therethrough, a green filter that allows light in a green wavelength region to transmit therethrough, and a blue filter that allows light in a blue wavelength region to transmit therethrough. However, the disclosure is not limited thereto, and each of the plurality of pixels PX may include a color filter that allows light in a wavelength region of a different color to transmit therethrough or a transparent filter. In an example embodiment, each of the plurality of pixels PX may include one of a white color filter, a cyan color filter, a magenta color filter, and a yellow color filter.

The controller 120 may control the operation of the row driver 140, control the operation of the ramp signal generator 130, and control the operation of the read-out circuit 150. The controller 120 may include a control register block, and the control register block may control the operations of the row driver 140, the ramp signal generator 130, and the read-out circuit 150 under the control of the DSP. In an example embodiment, the controller 120 may control the row driver 140, the ramp signal generator 130, and the read-out circuit 150 such that the image sensor 100 operates in a global shutter mode.

The row driver 140 may generate control signals CSs for controlling the pixel array 110 and provide the control signals CSs to each of the plurality of pixels PX. In an example embodiment, the row driver 140 may determine activation and deactivation timing of the control signals CSs with respect to each of the plurality of pixels PX so as to operate in the global shutter mode.

The control signals CSs may be generated to respectively correspond to rows of the pixel array 110 such that the pixel array 110 is controlled for each row. The pixel array 110 may output pixel signals including a reset signal and an image signal from one or more selected rows to the read-out circuit 150, in response to control signals CSs provided from the row driver 140.

The ramp signal generator 130 may generate a ramp signal RAMP. The ramp signal RAMP is a signal for converting an analog signal into a digital signal and may be generated to be in the shape of a triangular wave. The ramp signal generator 130 may provide the ramp signal RAMP to the read-out circuit 150, for example, a CDS circuit.

The read-out circuit 150 may sample and hold the pixel signal provided by the pixel array 110. For example, the read-out circuit 150 may receive the ramp signal RAMP generated by the ramp signal generator 130, and may generate image data ID by analog-digital converting a result of comparing each of a reset signal, a first reference signal, a second reference signal, and an image signal with the ramp signal RAMP. A detailed configuration and operation of the read-out circuit 150 will be described later in the description of FIG. 4.

Figure 2:
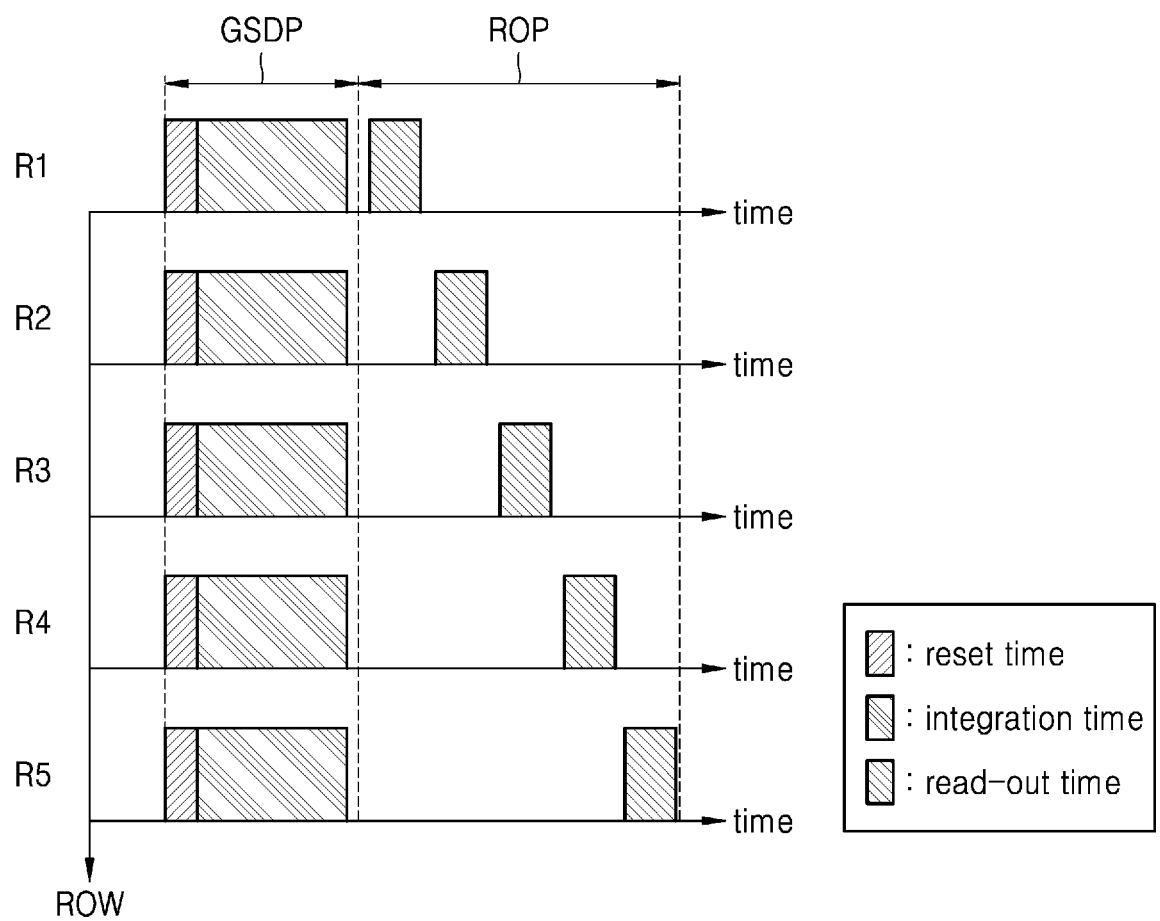
FIG. 2 is a diagram illustrating an operation of an image sensor in a global shutter mode according to an example embodiment.

FIG. 2 is a diagram illustrating an operation of the image sensor 100 in a global shutter mode according to an example embodiment.

Referring to FIGS. 1 and 2, the image sensor 100 may be driven in the global shutter mode. In the global shutter mode, the image sensor 100 may perform a global signal dumping operation during a global signal dumping period GSDP and a read-out operation during a read-out period ROP. The global signal dumping operation may include a reset operation of resetting charges integrated in a floating diffusion node during a reset time, and an integration operation of integrating photocharges generated by a photoelectric conversion element during an integration time. In the read-out period ROP, a rolling read-out operation of sequentially performing the read-out operation during the read-out time for each row may be performed.

The image sensor 100 may operate in the global shutter mode, thereby controlling a photocharge integration time to be equal for each of the pixels PX arranged in different rows, and avoiding a distortion of an image that may be caused due to a difference in the photocharge integration time. However, the image sensor 100 may be driven in a rolling shutter mode as an operation mode is switched. When the image sensor 100 is driven in the rolling shutter mode, the image sensor 100 may control the photocharge integration time of a photodiode PD to be different for each row of the pixel array 110. According to an example embodiment, when the image sensor 100 is driven in the global shutter mode, the photocharge integration time may be the same for all rows, or may be the same for each row of a certain group. The operation mode of the image sensor 100 may be set by a DSP.

Figure 3:
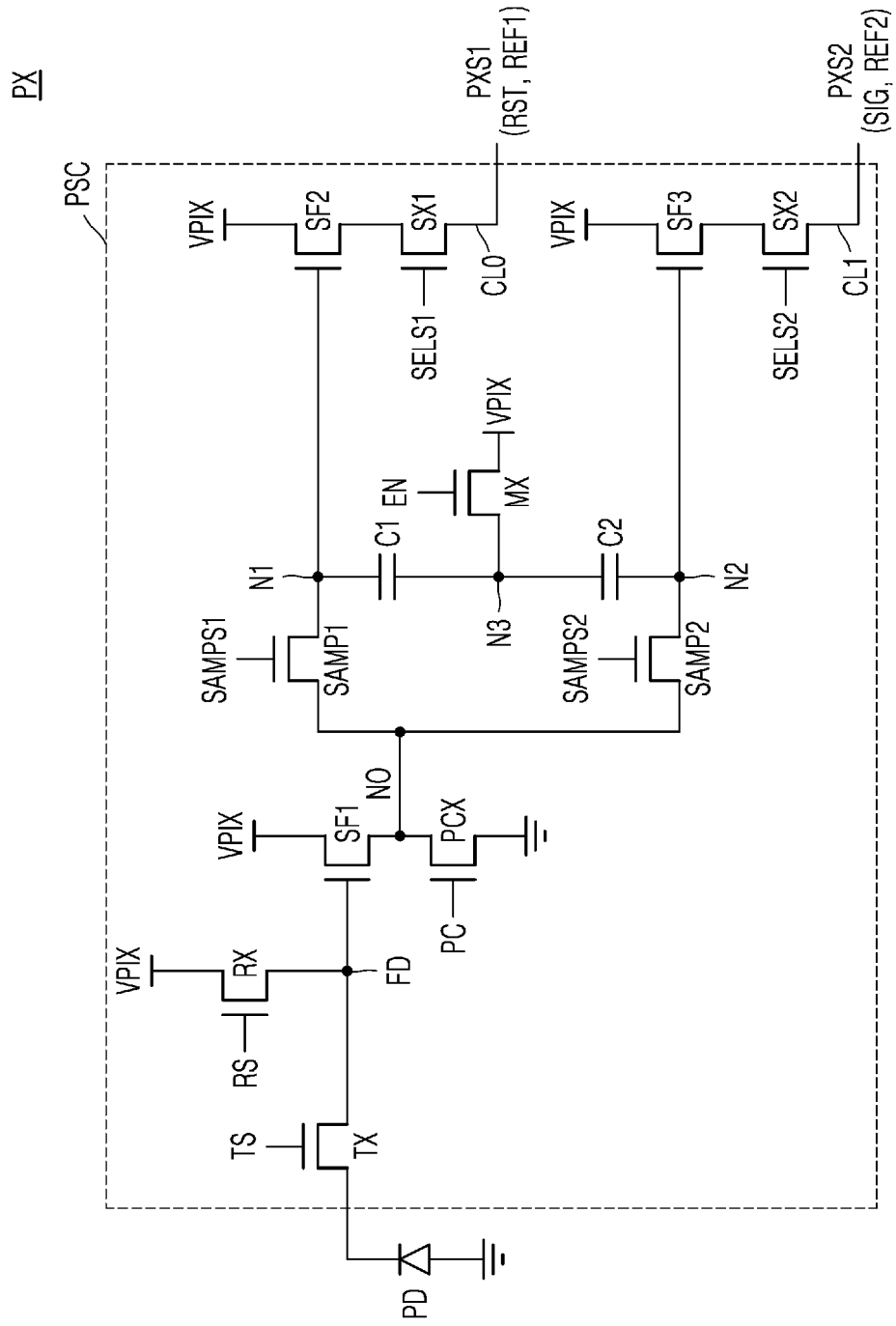
FIG. 3 is a circuit diagram of a pixel included in an image sensor according to an example embodiment.

FIG. 3 is a circuit diagram of a pixel included in an image sensor according to an example embodiment.

Referring to FIG. 3, the pixel PX may include a photodiode PD and a pixel signal generation circuit PSC that generates pixel signals PXS1 and PXS2. Control signals TS, RS, PC, SAMPS1, SAMPS2, EN, SELS1, and SELS2 applied to the pixel signal generation circuit PSC may be some of the control signals CSs generated by the row driver 140.

The photodiode PD may generate photocharges that vary according to the intensity of light. For example, the photodiode PD may generate charges, that is, electrons that are negative charges and holes that are positive charges, in proportion to the amount of incident light. The photodiode PD is an example of a photoelectric conversion element, and may be at least one of a photo transistor, a photo gate, a pinned photo diode (PPD), and a combination thereof.

The pixel signal generation circuit PSC may include a plurality of transistors TX, RX, SF1, PCX, SAMP1, SAMP2, MX, SF2, SF3, SX1, and SX2, a first capacitor C1, and a second capacitor C2. In the first capacitor C1 and the second capacitor C2, charges may be integrated according to a reset operation or charges may be integrated according to a photocharge integration operation.

The pixel signal generation circuit PSC may include a transfer transistor TX. The transfer transistor TX may be connected between the photodiode PD and a floating diffusion node FD. A first terminal of the transfer transistor TX may be connected to an output terminal of the photodiode PD, and a second terminal of the transfer transistor TX may be connected to the floating diffusion node FD. The transfer transistor TX may be turned on or off in response to a transfer control signal TS received from the row driver 140, and may transmit the photocharge generated by the photodiode PD to the floating diffusion node FD.

The pixel signal generation circuit PSC may include a reset transistor RX. The reset transistor RX may reset charges integrated in the floating diffusion node FD. A pixel voltage VPIX (for example, a power voltage) may be applied to a first terminal of the reset transistor RX, and a second terminal of the reset transistor RX may be connected to the floating diffusion node FD. The reset transistor RX may be turned on or off in response to a reset control signal RS received from the row driver 140, and charges integrated in the floating diffusion node FD may be discharged and thus the floating diffusion node FD may be reset.

The pixel signal generation circuit PSC may include a first source follower transistor SF1. The pixel voltage VPIX may be applied to a first terminal of the first source follower transistor SF1, and a second terminal of the first source follower transistor SF1 may be connected to an output node NO. The first source follower transistor SF1 is a buffer amplifier and may buffer a signal according to the amount of charges charged in the floating diffusion node FD. The potential of the floating diffusion node FD may change according to the amount of charges integrated in the floating diffusion node FD, and the first source follower transistor SF1 may amplify and output a potential change of the floating diffusion node FD to the output node NO.

The pixel signal generation circuit PSC may include a precharge transistor PCX. A first terminal of the precharge transistor PCX may be connected to the output node NO, and a ground voltage GND may be applied to a second terminal of the precharge transistor PCX. The precharge transistor PCX may operate as a current source according to a precharge control signal PC received from the row driver 140.

In an example embodiment, an additional transistor may be connected in series between the first source follower transistor SF1 and the precharge transistor PCX. An operation of removing charges remaining in the output node NO may be selectively performed according to a switching operation of the additional transistor.

The pixel signal generation circuit PSC may include a first sampling transistor SAMP1 and a second sampling transistor SAMP2. The first sampling transistor SAMP1 may be connected between the output node NO and a first node N1, and the second sampling transistor SAMP2 may be connected between the output node NO and a second node N2. The first sampling transistor SAMP1 may be turned on or off in response to a first sampling control signal SAMP1 received from the row driver 140. The second sampling transistor SAMP2 may be turned on or off in response to a second sampling control signal SAMPS2 received from the row driver 140.

The first capacitor C1 may be connected between the first node N1 and a third node N3. Charges may be integrated in the first capacitor C1 according to a switching operation of the first sampling transistor SAMP1. The second capacitor C2 may be connected between the second node N2 and the third node N3. Charges may be integrated in the second capacitor C2 according to a switching operation of the second sampling transistor SAMP2. For example, charges according to the reset operation may be integrated in the first capacitor C1 and charges according to the photocharge integration operation may be integrated in the second capacitor C2.

The pixel signal generation circuit PSC may include a mode transistor MX. The pixel voltage VPIX may be applied to a first terminal of the mode transistor MX, and a second terminal of the mode transistor MX may be connected to the third node N3. The mode transistor MX may be turned on or off according to a mode control signal EN, and may adjust a voltage applied to the third node N3 connected to the first capacitor C1 and the second capacitor C2 when switched.

The pixel signal generation circuit PSC may include a second source follower transistor SF2 and a first selection transistor SX1. The pixel voltage VPIX may be applied to a first terminal of the second source follower transistor SF2, and a second terminal of the second source follower transistor SF2 may be connected to the first selection transistor SX1. The second source follower transistor SF2 may buffer a signal according to the amount of charges charged in the first node N1. The second source follower transistor SF2 may amplify a potential change of the first node N1, and output the amplified potential change of the first node N1.

A first terminal of the first selection transistor SX1 may be connected to the second source follower transistor SF2, and a second terminal of the first selection transistor SX1 may be connected to a first column line CL0. The first selection transistor SX1 may be turned on or off in response to a first selection control signal SELS1 received from the row driver 140. When the first selection transistor SX1 is turned on, a first pixel signal PXS1 including a reset signal RST corresponding to the reset operation may be output to the first column line CL0.

The pixel signal generation circuit PSC may include a third source follower transistor SF3 and a second selection transistor SX2. The pixel voltage VPIX may be applied to a first terminal of the third source follower transistor SF3, and a second terminal of the third source follower transistor SF3 may be connected to the second selection transistor SX2. The third source follower transistor SF3 may buffer a signal according to the amount of charges charged in the second node N2. The third source follower transistor SF3 may amplify a potential change of the second node N2 and output the amplified potential change of the second node N2.

A first terminal of the second selection transistor SX2 may be connected to the third source follower transistor SF3, and a second terminal of the second selection transistor SX2 may be connected to a second column line CL1. The second selection transistor SX2 may be turned on or off in response to a second selection control signal SELS2 received from the row driver 140. When the second selection transistor SX2 is turned on, a second pixel signal PXS2 including an image signal SIG corresponding to the charge integration operation may be output to the second column line CL1.

For example, the first pixel signal PXS1 may include a reset signal RST corresponding to the reset operation and a first reference signal REF1 generated to remove an offset, and the second pixel signal PXS2 may include the image signal SIG corresponding to the charge integration operation and a second reference signal REF2 generated to remove an offset. Because the first pixel signal PXS1 is output through the second source follower transistor SF2 and the second pixel signal PXS2 is output through the third source follower transistor SF3, due to a difference in the threshold voltage of the second source follower transistor SF2 and the threshold voltage of the third source follower transistor SF3, an offset may be generated between the reset signal RST and the image signal SIG. Accordingly, the image sensor 100 may generate and use the first reference signal REF1 and the second reference signal REF2 to remove the offset between the reset signal RST and the image signal SIG.

The pixel PX of the image sensor 100 according to an example embodiment may include the first capacitor C1 configured to store charges according to the reset operation, the second capacitor C2 configured to store charges according to the charge integration operation, and the mode transistor MX connected between the first capacitor C1 and the second capacitor C2. According to turning on or off of the mode transistor MX, the connection relationship between the first capacitor C1 and the second capacitor C2 may change, and the magnitude of an equivalent capacitance in the first node N1 and the second node N2 may change. In the read-out period ROP, the equivalent capacitance when the first reference signal REF1 and the second reference signal REF2 are output may be controlled to be smaller than the equivalent capacitance when the image signal SIG and the reset signal RST are output, and thus a voltage settling time of the first node N1 and the second node N2 may be reduced, and the speed at which the first reference signal REF1 and the second reference signal REF2 are respectively output to the first column line CL0 and the second column line CL1 may increase.

Figure 4:
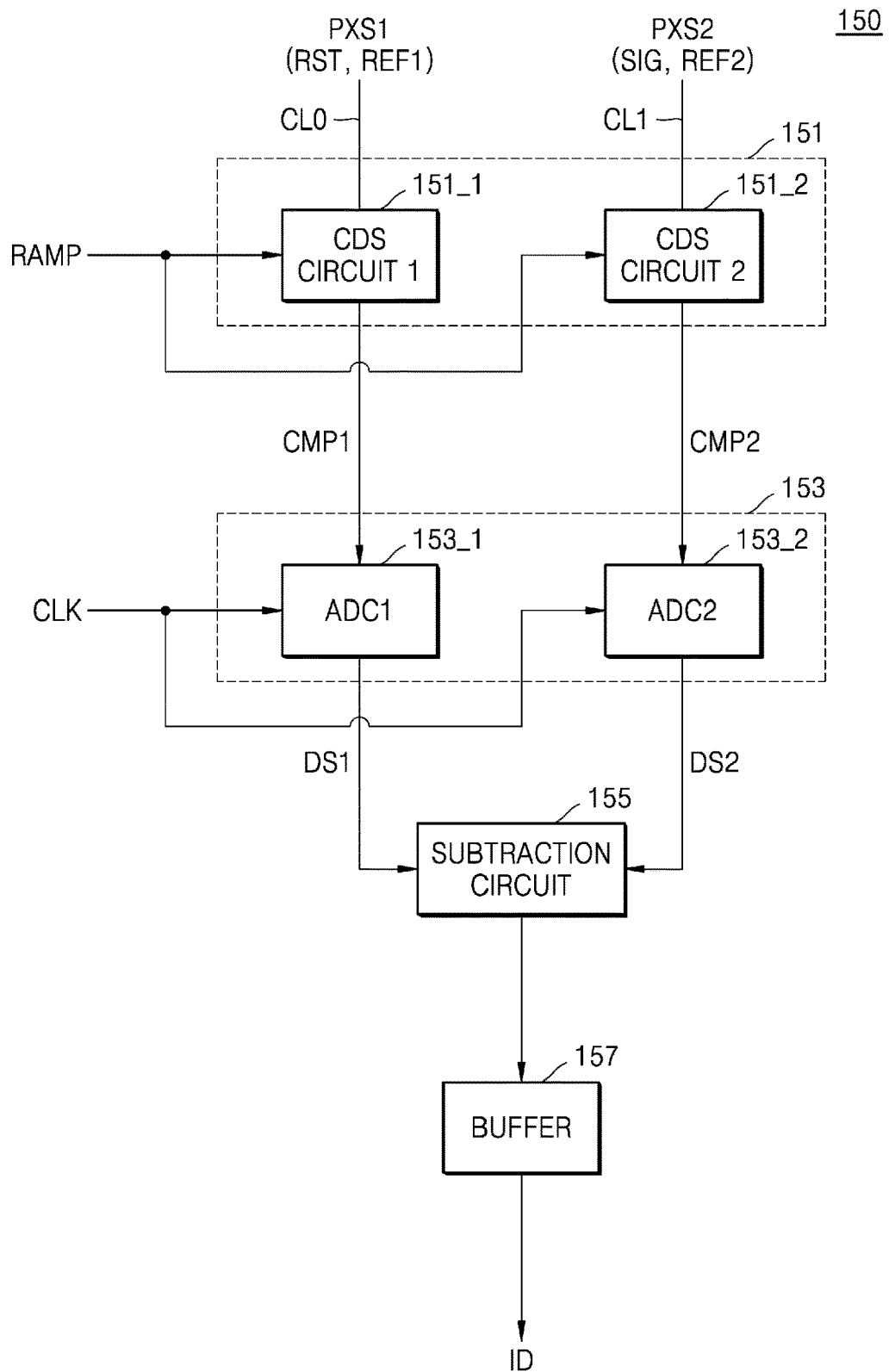
FIG. 4 is a block diagram illustrating a partial configuration of a read-out circuit connected to a first column line and a second column line of an image sensor according to an example embodiment.

FIG. 4 is a block diagram illustrating a partial configuration of the read-out circuit 150 connected to the first column line CL0 and the second column line CL1 of an image sensor according to an example embodiment.

Referring to FIG. 4, the read-out circuit 150 may include CDS circuits 151, analog-digital converters (ADCs) 153, a subtraction circuit 155, and a buffer 157. The CDS circuits 151 may include a first CDS circuit 151_1 connected to the first column line CL0 and a second CDS circuit 151_2 connected to the second column line CL1. The ADCs 153 may include a first ADC 153_1 connected to the first CDS circuit 151_1 and a second ADC 153_2 connected to the second CDS circuit 151_2. In FIG. 4, the two CDS circuits, that is, the first and second CDS circuits 151_1 and 151_2, and the two ADCs, that is, the ADCs 153_1 and 153_2, connected to the first column line CL0 and the second column line CL2 are illustrated, but the image sensor according to embodiments of the disclosure is not limited thereto, and the image sensor may include a number of CDS circuits corresponding to the number of column lines and a number of ADCs corresponding to the number of column lines.

The first CDS circuit 151_1 may sample and hold the first pixel signal PXS1 provided through the first column line CL0. For example, the first pixel signal PXS1 provided from the first column line CL0 may include the reset signal RST and the first reference signal REF1, and the first CDS circuit 151_1 may double sample the reset signal RST and the first reference signal REF1.

The first CDS circuit 151_1 may compare the ramp signal RAMP to the first pixel signal PXS1. The first CDS circuit 151_1 may output a first comparison signal CMP1 obtained by comparing the ramp signal RAMP and the reset signal RST and comparing the ramp signal RAMP and the first reference signal REF1.

The second CDS circuit 151_2 may sample and hold the second pixel signal PXS2 provided through the second column line CL1. For example, the second pixel signal PXS2 provided to the second column line CL1 may include the image signal SIG and the second reference signal REF2, and the second CDS circuit 151_2 may double sample the image signal SIG and the second reference signal REF2.

The second CDS circuit 151_2 may compare the ramp signal RAMP and the second pixel signal PXS2. The second CDS circuit 151_2 may output a second comparison signal CMP2 obtained by comparing the ramp signal RAMP and the image signal SIG and comparing the ramp signal RAMP and the second reference signal REF2.

The first ADC 153_1 may generate a first digital signal DS1 by receiving the first comparison signal CMP1 and a clock signal CLK. For example, the first ADC 153_1 may generate a first count value by performing a counting operation in synchronization with the clock signal CLK in a period in which the first comparison signal CMP1 corresponding to the reset signal RST (that is, the first comparison signal CMP1 obtained by comparing the ramp signal RAMP and the reset signal RST) has a specific logic level and may generate a second count value by performing the counting operation in synchronization with the clock signal CLK in a period in which the first comparison signal CMP1 corresponding to the first reference signal REF1 (that is, the first comparison signal CMP that is obtained by comparing the ramp signal RAMP and the first reference signal REF1) has a specific logic level. Thereafter, the first ADC 153_1 may subtract the first count value from the second count value to generate the first digital signal DS1.

The second ADC 153_2 may receive the second comparison signal CMP2 and the clock signal CLK to generate a second digital signal DS2. For example, the second ADC 153_2 may generate a first count value by performing the counting operation in synchronization with the clock signal CLK in a period in which the second comparison signal CMP2 corresponding to the image signal SIG (that is, the second comparison signal CMP2 obtained by comparing the ramp signal RAMP and the image signal SIG) has a specific logic level and may generate a second count value by performing the counting operation in synchronization with the clock signal CLK in the period in which the second comparison signal CMP2 corresponding to second reference signal REF2 (that is, the second comparison signal CMP2 obtained by comparing the ramp signal RAMP and the second reference signal REF2) has a specific logic level. Thereafter, the second ADC 153_2 may subtract the first count value from the second count value to generate the second digital signal DS2.

The subtraction circuit 155 may subtract the second digital signal DS2 from the first digital signal DS1 to generate a digital signal obtained by removing a data value corresponding to a reset signal from a data value corresponding to an image signal. The subtraction circuit 155 may transmit a digital signal according to a result of a subtraction operation to the buffer 157, and the buffer 157 may output the image data ID.

For example, after the reset signal RST is output to the first column line CL0, the first reference signal REF1 may be output to the first column line CL0, and after the image signal SIG is output to the second column line CL1, the second reference signal REF2 may be output to the second column line CL1. The image sensor according to the may remove an offset generated in the second pixel signal PXS2 compared to the first pixel signal PXS1 due to the third source follower transistor SF3, which is different from the second source follower transistor SF2, through which the second pixel signal PXS2 is output. A specific offset may be generated in the image signal SIG compared to the reset signal RST, and the same specific offset may be generated in the second reference signal REF2 compared to the first reference signal REF1. The second digital signal DS2 is generated by the second CDS circuit 151_2 and the second ADC 153_2 by substantially subtracting the image signal SIG from the second reference signal REF2, the offset generated in each of the second reference signal REF2 and the image signal SIG may be removed.

Figure 5:
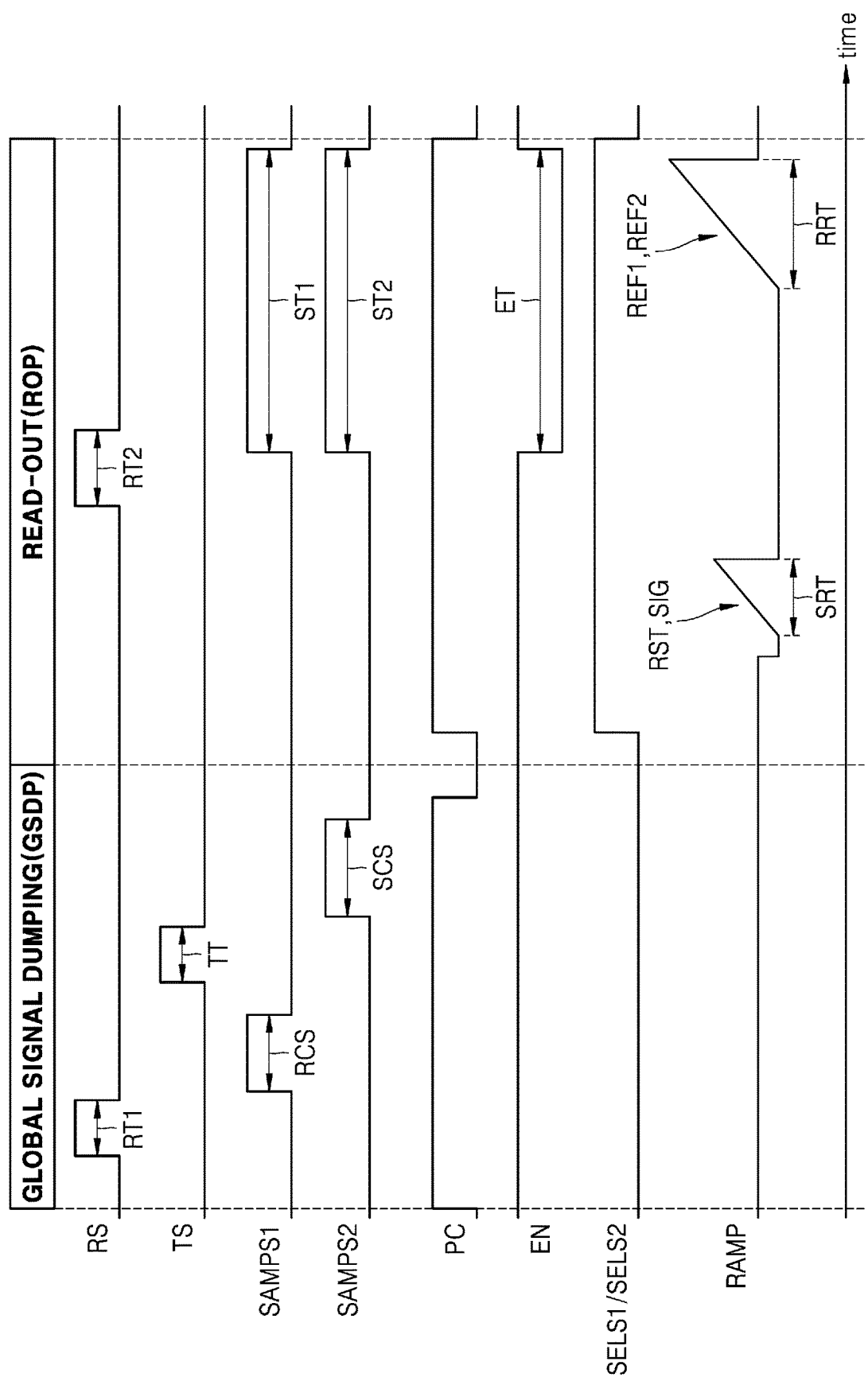
FIG. 5 is a timing diagram illustrating control signals and a ramp signal provided to a pixel of an image sensor according to an example embodiment.

FIG. 5 is a timing diagram illustrating control signals and a ramp signal provided to a pixel of an image sensor according to an example embodiment. The same control signals may be provided to pixels arranged in the same row.

Referring to FIGS. 3 to 5, operations described below may be performed in the global signal dumping period GSDP. The reset control signal RS may transition from a second level (e.g., a low level) to a first level (e.g., a high level) to maintain the first level during a first reset time RT1, and then may maintain the low level. As the reset transistor RX is turned on by the reset control signal RS of a high level, the floating diffusion node FD may be reset (a reset operation). For example, the voltage of the floating diffusion node FD may be reset to the pixel voltage VPIX.

After the reset control signal RS transitions from the high level to the low level, the first sampling control signal SAMPS1 may maintain the high level during a reset settling time RCS. As the first sampling transistor SAMP1 is turned on by the first sampling control signal SAMPS1 of the high level, the voltage of the reset floating diffusion node FD may be sampled to the first capacitor C1 connected to the first node N1.

After the first sampling control signal SAMPS1 transitions from the high level to the low level, a transfer control signal TS may transition from the low level to the high level and maintain the high level during an integration time TT. As the transfer transistor TX is turned on by the transfer control signal TS of the high level, photocharges generated by the photodiode PD may be integrated (an integration operation) in the floating diffusion node FD. For example, the voltage of the floating diffusion node FD may decrease from the pixel voltage VPIX according to the amount of integrated charges.

After the transfer control signal TS transitions from the high level to the low level, the second sampling control signal SAMPS2 may maintain the high level during a signal settling time SCS. As the second sampling transistor SAMP2 is turned on by the second sampling control signal SAMPS2 of the high level, the voltage of the floating diffusion node FD may be sampled to the second capacitor C2 connected to the second node N2.

Before the first sampling control signal SAMPS1 transitions from the low level to the high level, a precharge control signal PC may transition from the low level to the high level, and may maintain the high level until after the second sampling control signal SAMPS2 transitions from the high level to the low level. The precharge transistor PCX may be turned on and the output node NO may be precharged by the precharge control signal PC of the high level. That is, the output node NO to which the first sampling transistor SAMP1 and the second sampling transistor SAMP2 are connected may be precharged.

In the global signal dumping period GSDP, the first selection control signal SELS1 and the second selection control signal SELS2 may maintain the low level. The mode control signal EN may maintain the high level in the global signal dumping period GSDP.

Operations described below may be performed during the read-out period ROP. The first selection control signal SELS1 and the second selection control signal SEL2 may maintain the low level during the global signal dumping period GSDP and may transition to the high level in the read-out period ROP. As the first selection control signal SELS1 and the second selection control signal SEL2 transition to the high level, the first selection transistor SX1 and the second selection transistor SX2 may be turned on. Accordingly, the reset signal RST corresponding to a charge according to the reset operation sampled to the first capacitor C1 may be output through the first column line CL0, and the image signal SIG corresponding to a charge according to the integration operation sampled to the second capacitor C2 may be output through the second column line CL1.

In the read-out period ROP, the precharge control signal PC may transition from the low level to the high level, and then maintain the high level. However, in an example embodiment, unlike FIG. 5, the precharge control signal PC may maintain the high level in the global signal dumping period GSDP and the read-out period ROP.

After the first selection transistor SX1 and the second selection transistor SX2 are turned on, the ramp signal RAMP may be generated to increase (or decrease) at a constant inclination for a first time SRT. During the first time SRT when the voltage level of the ramp signal RAMP constantly changes, the first CDS circuit 151_1 may compare the ramp signal RAMP to the reset signal RST, and the second CDS circuit 151_2 may compare the ramp signal RAMP and the image signal SIG.

After the reset signal RST and the image signal SIG are output, the reset control signal RS may maintain the high level for a second reset time RT2. As the reset transistor RX is turned on by the reset control signal RS of the high level, the floating diffusion node FD may be reset. For example, the voltage of the floating diffusion node FD may be reset to the pixel voltage VPIX.

After the reset control signal RS transitions to the high level, the first sampling control signal SAMPS1 may transition from the low level to the high level, and maintain the high level during a first settling time ST1. After the reset control signal RS transitions to the high level, the second sampling control signal SAMPS2 may transition from the low level to the high level, and maintain the high level during a second settling time ST2. In an example embodiment, the first settling time ST1 and the second settling time ST2 may overlap each other, and for example, may coincide with each other.

Because the first sampling transistor SAMP1 and the second sampling transistor SAMP2 are turned on at the same time, the voltage of the first node N1 may be the same as the voltage of the second node N2. Because the first selection control signal SELS1 and the second selection control signal SEL2 maintain a high level, the first reference signal REF1 corresponding to the voltage of the first node N1 may be output through the first column line CL0, and the second reference signal REF2 may be output through the second column line CL1. Even if the voltage of the first node N1 is the same as the voltage of the second node N2, due to a difference in the threshold voltage between the second source follower transistor SF2 and the third source follower transistor SF3, the second reference signal REF2 may include an offset compared to the first reference signal REF1.

After the first sampling transistor SAMP1 and the second sampling transistor SAMP2 are turned on, the ramp signal RAMP may be generated to increase (or decrease) at a constant inclination during a second time RRT. During the second time RRT when the voltage level of the ramp signal RAMP constantly changes, the first CDS circuit 151_1 may compare the ramp signal RAMP to the first reference signal REF1, and the second CDS circuit 151_2 may compare the ramp signal RAMP to the second reference signal REF2.

In an example embodiment, the transfer control signal TS may maintain the low level during the global signal dumping period GSDP.

The pixel PX of the image sensor according to an example embodiment may further include the mode transistor MX connected to the first capacitor C1 and the second capacitor C2, and the mode control signal EN may maintain the high level during the global signal dumping period GSDP. During the global signal dumping period GSDP, the mode transistor MX may maintain a turn-on state according to the mode control signal EN, and apply the pixel voltage VPIX to the third node N3.

During the read-out period ROP, while the reset signal SIG and the image signal SIG are output, the mode control signal EN may maintain the high level. The pixel voltage VPIX may be applied to the third node N3.

When the first sampling control signal SAMPS1 transitions from the low level to the high level, and the second sampling control signal SAMPS2 transitions from the low level to the high level, the mode control signal EN may transition from the high level to the low level. For example, after the reset control signal RS transitions to the high level, the mode control signal EN may transition from the high level to the low level, and maintain the low level for a mode switching time ET. In an example embodiment, the first settling time ST1, the second settling time ST2, and the mode switching time ET may overlap each other, and for example, may coincide with each other.

The mode transistor MX may be turned off by the mode control signal EN of the low level, and may float the third node N3. The equivalent capacitance of the first node N1 and the second node N2 may be less than the capacitance of the first capacitor C1 and less than the capacitance of the second capacitor C2. Accordingly, the speed at which the voltages of the first node N1 and the second node N2 settle may increase, the speed at which the first reference signal REF1 is output to the first column line CL0 may increase, and the speed at which the second reference signal REF2 is output to the second column line CL1 may increase.

That is, the image sensor according to the example embodiment controls a switching operation of the mode transistor MX, thereby increasing the speed at which the first reference signal REF1 and the second reference signal REF2 are output compared to the speed at which the reset signal SIG and the image signal SIG are output. Because the first reference signal REFI and the second reference signal REF2 are signals generated to remove the offset generated due to the difference in threshold voltage between the second source follower transistor SF2 and the third source follower transistor SF3, the first reference signal REF1 and the second reference signal REF2 do not affect the previously output image signal SIG and reset signal RST. The speed at which the first reference signal REF1 and the second reference signal REF2 are output increases, and thus, the speed at which the image data ID is output may also increase.

Figure 6:
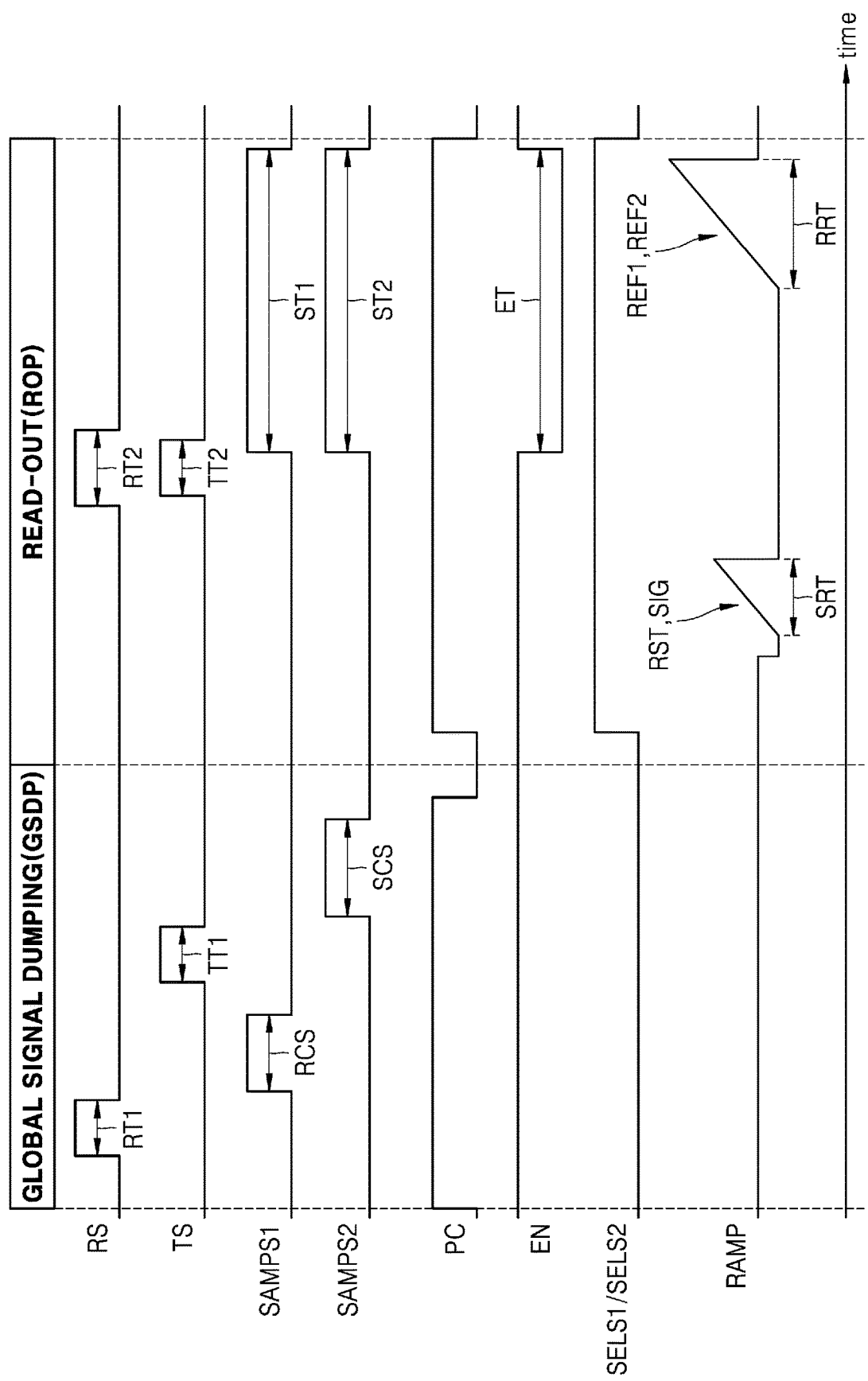
FIG. 6 is a timing diagram illustrating control signals and a ramp signal provided to a pixel of an image sensor according to an example embodiment.

FIG. 6 is a timing diagram illustrating control signals and a ramp signal provided to a pixel of an image sensor according to an example embodiment. The same control signals may be provided to pixels arranged in the same row. In the description of FIG. 6, redundant descriptions with FIG. 5 will be omitted.

Referring to FIGS. 3, 4 and 6, during the global signal dumping period GSDP, after the first sampling control signal SAMPS1 transitions from a high level to a low level, the transfer control signal TS may have the high level for a first integration time TT1. As the transfer transistor TX is turned on by the transfer control signal TS of the high level, photocharges generated by the photodiode PD may be integrated in the floating diffusion node FD. For example, the voltage of the floating diffusion node FD may decrease from the pixel voltage VPIX according to the amount of integrated charges.

In the read-out period ROP, the transfer control signal TS may have the high level for a second integration time TT2. In this regard, the second integration time TT2 may be included in the second reset time RT2 when the reset control signal RS has the high level. Accordingly, even if the transfer control signal TS has the high level, the floating diffusion node FD may be reset and may be the pixel voltage VPIX. A row to which the control signals described with respect to FIG. 6 are provided may perform a global shutter operation even during the read-out period ROP.

Figure 7:
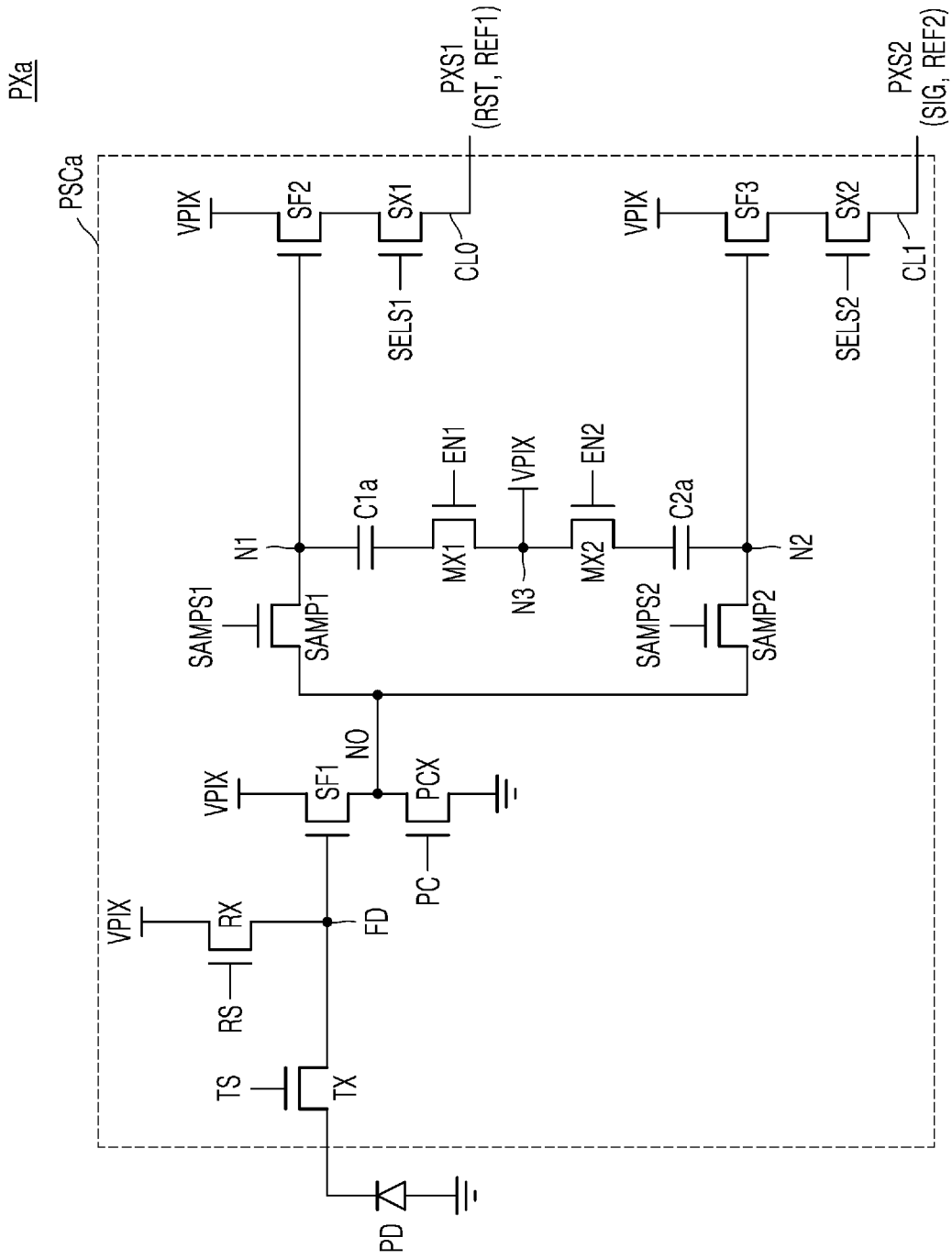
FIGS. 7 and 8 are circuit diagrams of pixels included in an image sensor according to an example embodiment.
Figure 8:
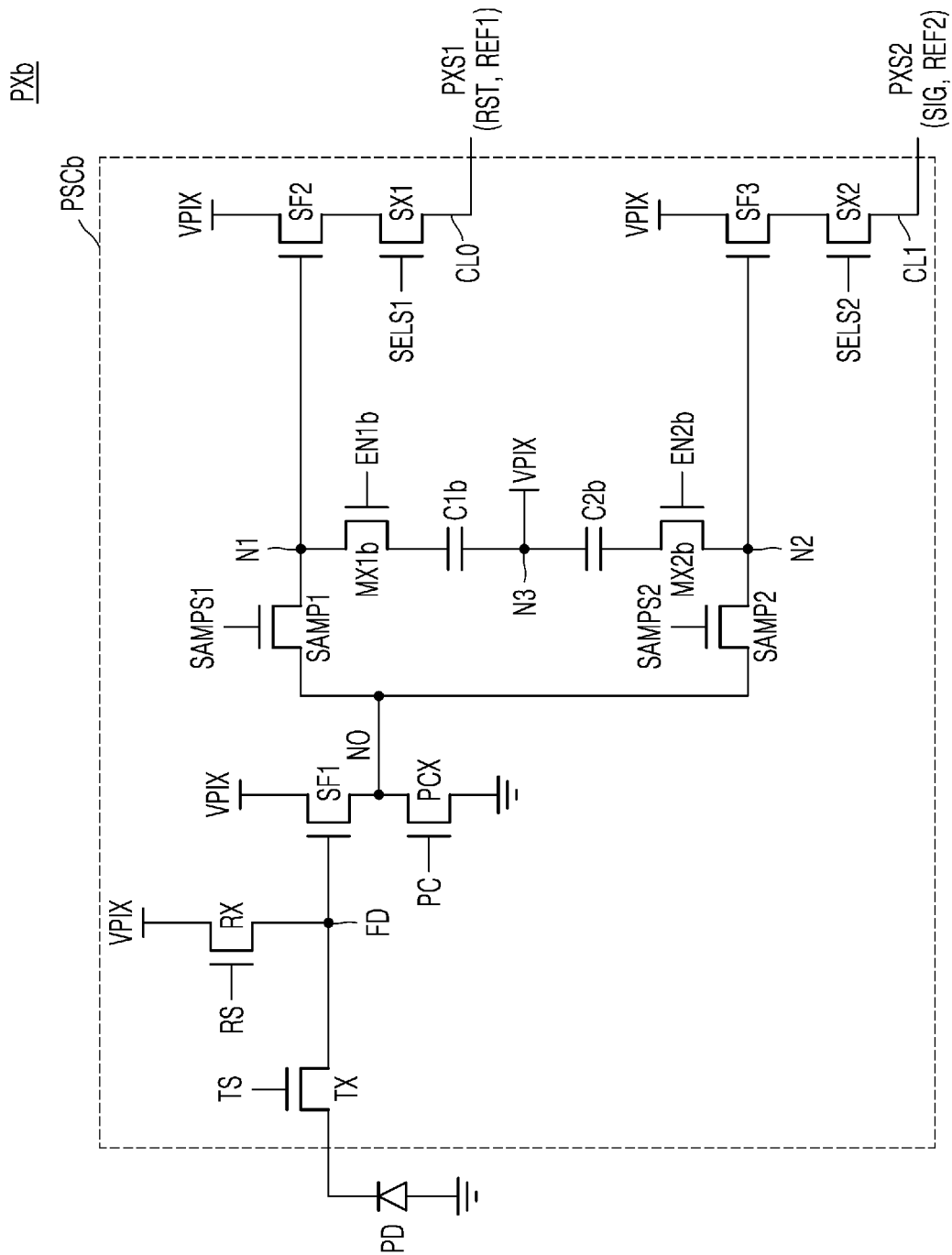

FIGS. 7 and 8 are circuit diagrams of pixels PXa and PXb included in an image sensor according to an example embodiment. The same control signals may be provided to pixels arranged in the same row. In FIGS. 7 and 8, redundant descriptions of the same reference numerals as in FIG. 3 will be omitted.

Referring to FIG. 7, the pixel PXa may include the photodiode PD and a pixel signal generation circuit PSCa that generates the pixel signals PXS1 and PXS2. The pixel signal generation circuit PSCa may include a plurality of transistors TX, RX, SF1, PCX, SAMP1, SAMP2, MX1, MX2, SF2, SF3, SX1, and SX2, a first capacitor C1$a$, and a second capacitor C2$a$. In the first capacitor C1$a$ and the second capacitor C2$a$, charges according to a reset operation may be integrated, or charges according to a photocharge integration operation may be integrated. The control signals TS, RS, PC, SAMPS1, SAMPS2, EN1, EN2, SELS1, and SELS2 applied to the pixel signal generation circuit PSCa may be some of the control signals CSs generated by the row driver 140.

The first capacitor C1$a$ may be connected between the first node N1 and the third node N3. Charges may be integrated in the first capacitor C1$a$ according to a switching operation of the first sampling transistor SAMP1. A first terminal of the first capacitor C1$a$ may be connected to the first node N1, and a second terminal of the first capacitor C1$a$ may be connected to a first mode transistor MX1 connected to the third node N3.

The pixel signal generation circuit PSCa may include the first mode transistor MX1. A first terminal of the first mode transistor MX1 may be connected to the first capacitor C1$a$, and the pixel voltage VPIX may be applied to a second terminal of the first mode transistor MX1. The first mode transistor MX1 may be turned on or off according to a first mode control signal EN1, and may adjust a voltage applied to a second terminal of the first capacitor C1a. For example, according to a switching operation of the first mode transistor MX1, the pixel voltage VPIX may be applied to the second terminal of the first capacitor C1a or the second terminal of the first capacitor C1a may float.

The second capacitor C2a may be connected between the second node N2 and the third node N3. Charges may be integrated in the second capacitor C2a according to the switching operation of the second sampling transistor SAMP2. A first terminal of the second capacitor C2a may be connected to the second node N2, and a second terminal of the second capacitor C2a may be connected to a second mode transistor MX2 connected to the third node N3.

The pixel signal generation circuit PSCa may include the second mode transistor MX2. The second capacitor C2a may be connected to a first terminal of the second mode transistor MX2, and the pixel voltage VPIX may be applied to a second terminal of the second mode transistor MX2. The second mode transistor MX2 may be turned on or off according to a second mode control signal EN2, and may adjust a voltage applied to the second terminal of the second capacitor C2a. For example, according to a switching operation of the second mode transistor MX2, the pixel voltage VPIX may be applied to the second terminal of the second capacitor C2a or the second terminal of the second capacitor C2a may float.

The pixel PXa of the image sensor according to the example embodiment may include the first capacitor C1a configured to store charges according to a reset operation, the second capacitor C2a configured to store charges according to a charge integration operation, the first mode transistor MX1 connected to one end of the first capacitor C1a, and the second mode transistor MX2 connected to one end of the second capacitor C2a. As the first mode transistor MX1 and the second mode transistor MX2 are turned on or off, the equivalent capacitance of the first node N1 and the second node N2 may change. In the read-out period ROP, the equivalent capacitance when the first reference signal REF1 and the second reference signal REF2 are output may be controlled to be less than the equivalent capacitance when the image signal SIG and the reset signal RST are output, and thus, the voltage settling time of the first node N1 and the second node N2 may be reduced, and the speed at which the signal REF1 and the second reference signal REF2 are respectively output to the first column line CL0 and the second column line CL1 may increase.

Referring to FIG. 8, the pixel PXb may include the photodiode PD and a pixel signal generation circuit PSCb that generates a pixel signal. The control signals TS, RS, PC, SAMPS1, SAMPS2, EN1b, EN2b, SELS1, and SELS2 applied to the pixel signal generation circuit PSCb may be some of the control signals CSs generated by the row driver 140.

The pixel signal generation circuit PSCb may include the plurality of transistors TX, RX, SF1, PCX, SAMP1, SAMP2, MX1b, MX2b, SF2, SF3, SX1, and SX2, a first capacitor C1b, and a second capacitor C2b. In each of the first capacitor C1b and the second capacitor C2b, charges according to the reset operation may be integrated or charge according to the photocharge integration operation may be integrated.

The first capacitor C1b may be connected between the first node N1 and the third node N3. Charges may be integrated in the first capacitor C1b according to a switching operation of the first sampling transistor SAMP1. A first terminal of the first capacitor C1b may be connected to a first mode transistor MX1b, and a second terminal of the first capacitor C1b may be connected to the third node N3 to which the pixel voltage VPIX is applied.

The pixel signal generation circuit PSCb may include the first mode transistor MX1b. The first terminal of the first mode transistor MX1b may be connected to the first node N1, and a second terminal of the first mode transistor MX1b may be connected to the first capacitor C1b. The first mode transistor MX1b may be turned on or off according to a first mode control signal EN1b, and the first capacitor C1b and the first node N1 may be electrically connected or disconnected according to the switching operation of the first mode transistor MX1b.

The second capacitor C2b may be connected between the second node N2 and the third node N3. Charges may be integrated in the second capacitor C2b according to the switching operation of the second sampling transistor SAMP2. A first terminal of the second capacitor C2b may be connected to the second mode transistor MX2b, and a second terminal of the second capacitor C2b may be connected to the third node N3 to which the pixel voltage VPIX is applied.

The pixel signal generation circuit PSCb may include a second mode transistor MX2b. A first terminal of the second mode transistor MX2b may be connected to the second node N2, and a second terminal of the second mode transistor MX2b may be connected to the second capacitor C2b. The second mode transistor MX2b may be turned on or off according to a second mode control signal EN2b, and the second capacitor C2b and the second node N2 may be electrically connected or disconnected according to the switching operation of the second mode transistor MX2b.

The pixel PXb of the image sensor according to an example embodiment may include the first capacitor C1b that stores charge according to the reset operation, the second capacitor C2b that stores charge according to the charge integration operation, the first mode transistor MX1b connected to one end of the first capacitor C1b, and the second mode transistor MX2b connected to one end of the second mode capacitor C2b. As the first mode transistor MX1b and the second mode transistor MX2b are turned on or off, the equivalent capacitance of the first node N1 and the second node N2 may change. During the read-out period ROP, the equivalent capacitance when the first reference signal REF1 and the second reference signal REF2 are output may be controlled to be less than the equivalent capacitance when the image signal SIG and the reset signal RST are output, and thus, the voltage settling time of the first node N1 and the second node N2 may be reduced, and the speed at which the first reference signal REF1 and the second reference signal REF2 are respectively output to the first column line CL0 and the second column line CL1 may increase.

Figure 9:
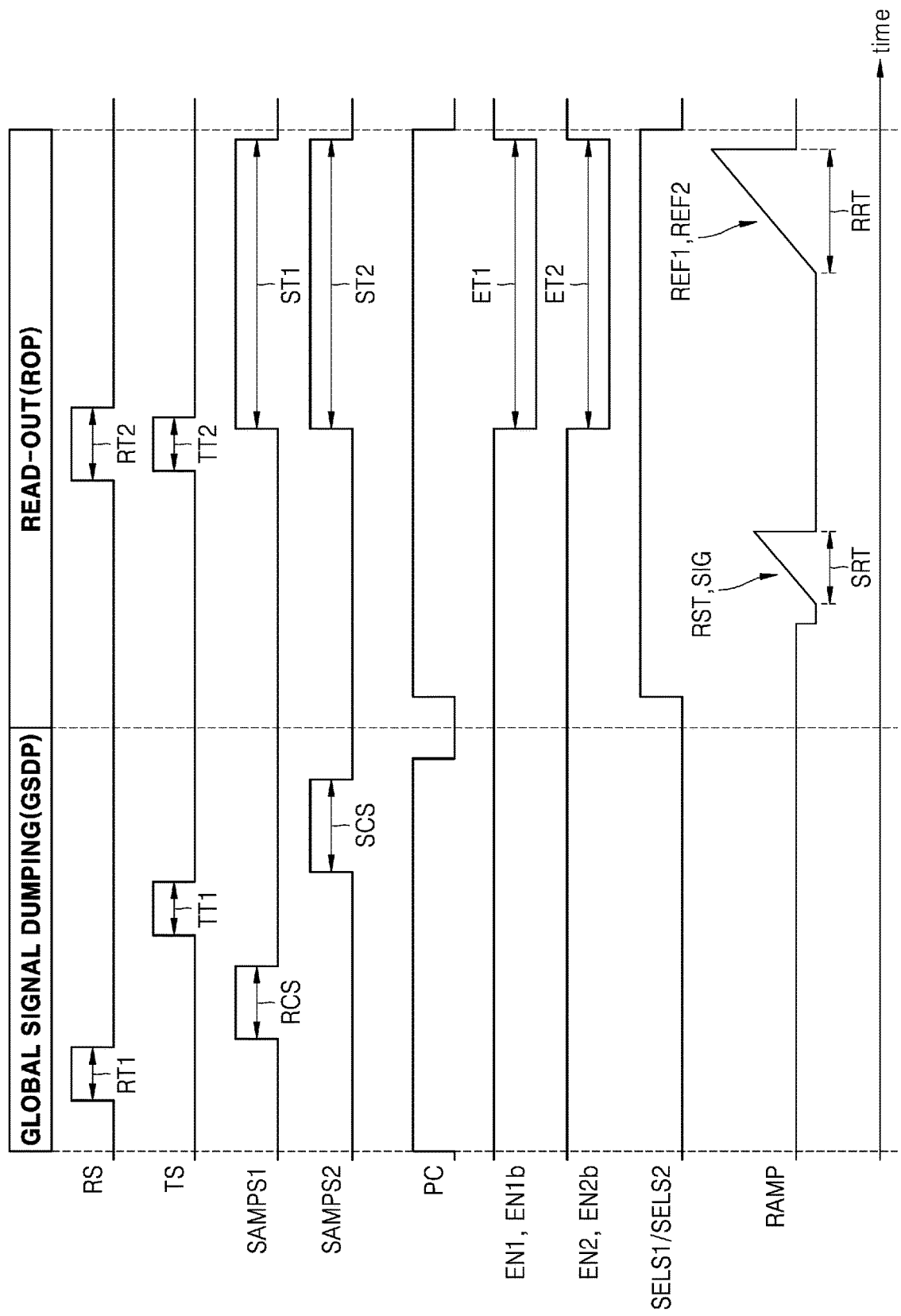
FIG. 9 is a timing diagram illustrating control signals and a ramp signal provided to a pixel of an image sensor according to an example embodiment.

FIG. 9 is a timing diagram illustrating control signals and a ramp signal provided to a pixel of an image sensor according to an example embodiment. In the description of FIG. 9, redundant descriptions given with respect to FIG. 5 will be omitted.

Referring to FIGS. 7 to 9, the pixels PXa and PXb of the image sensor according to an example embodiment may include the first mode transistors MX1 and MX1b respectively connected to the first capacitors C1a and C1b and the second mode transistors MX2 and MX2b respectively connected to the second capacitors C2a and C2b. The first mode control signals EN1 and EN1b and the second mode control signals EN2 and EN2b may maintain a high level during the global signal dumping period GSDP. In response to the first mode control signals EN1 and EN1b and the second mode control signals EN2 and EN2b during the global signal dumping period GSDP, the first mode transistors MX1 and MX1b and the second mode transistors MX2 and MX2b may maintain a turn-on state. While the reset signal RST and the image signal SIG are output during the read-out period ROP, the first mode control signals EN1 and EN1b and the second mode control signals EN2 and EN2b maintain the high level, and the first mode transistors MX1 and MX1b and the second mode transistors MX2 and MX2b may maintain the turn-on state.

In the read-out period ROP, when the first sampling control signal SAMPS1 transitions from a low level to a high level and the second sampling control signal SAMPS2 transitions from a low level to a high level, the first mode control signals EN1 and EN1b and the second mode control signals EN2 and EN2b may transition from a high level to a low level. For example, after the reset control signal RS transitions to the high level, the first mode control signals EN1 and EN1b may transition from the high level to the low level, and may maintain the low level for the first mode switching time ET1. Also, for example, after the reset control signal RS transitions to the high level, the second mode control signals EN2 and EN2b may transition from the high level to the low level, and may maintain the low level for the second mode switching time ET2. In an example embodiment, the first settling time ST1, the second settling time ST2, the first mode switching time ET1, and the second mode switching time ET2 may overlap each other, and for example, may coincide with each other.

The first mode transistors MX1 and MX1b may be turned off by the first mode control signals EN1 and EN1b of the low level, and the first node N1 and the third node N3 may be electrically separated. The second mode transistors MX2 and MX2b may be turned off by the second mode control signals EN2 and EN2b of the low level, and the second node N2 and the third node N3 may be electrically separated. Accordingly, the equivalent capacitance of the first node N1 and the second node N2 may be less than the capacitance of the first capacitor C1a or C1b and less than the capacitance of the second capacitor C2a or C2b. The speed at which the first reference signal REF1 is output to the first column line CL0 may increase, and the speed at which the second reference signal REF2 is output to the second column line CL1 may increase. That is, the image sensor according to the example embodiment may control the switching operation of the first mode transistors MX1 and MX1b and the second mode transistors MX2 and MX2b, thereby increasing the speed at which the first and second reference signals REF1 and REF2 are output compared to the speed at which the reset signal RST and the image signal SIG are output.

Figure 10:
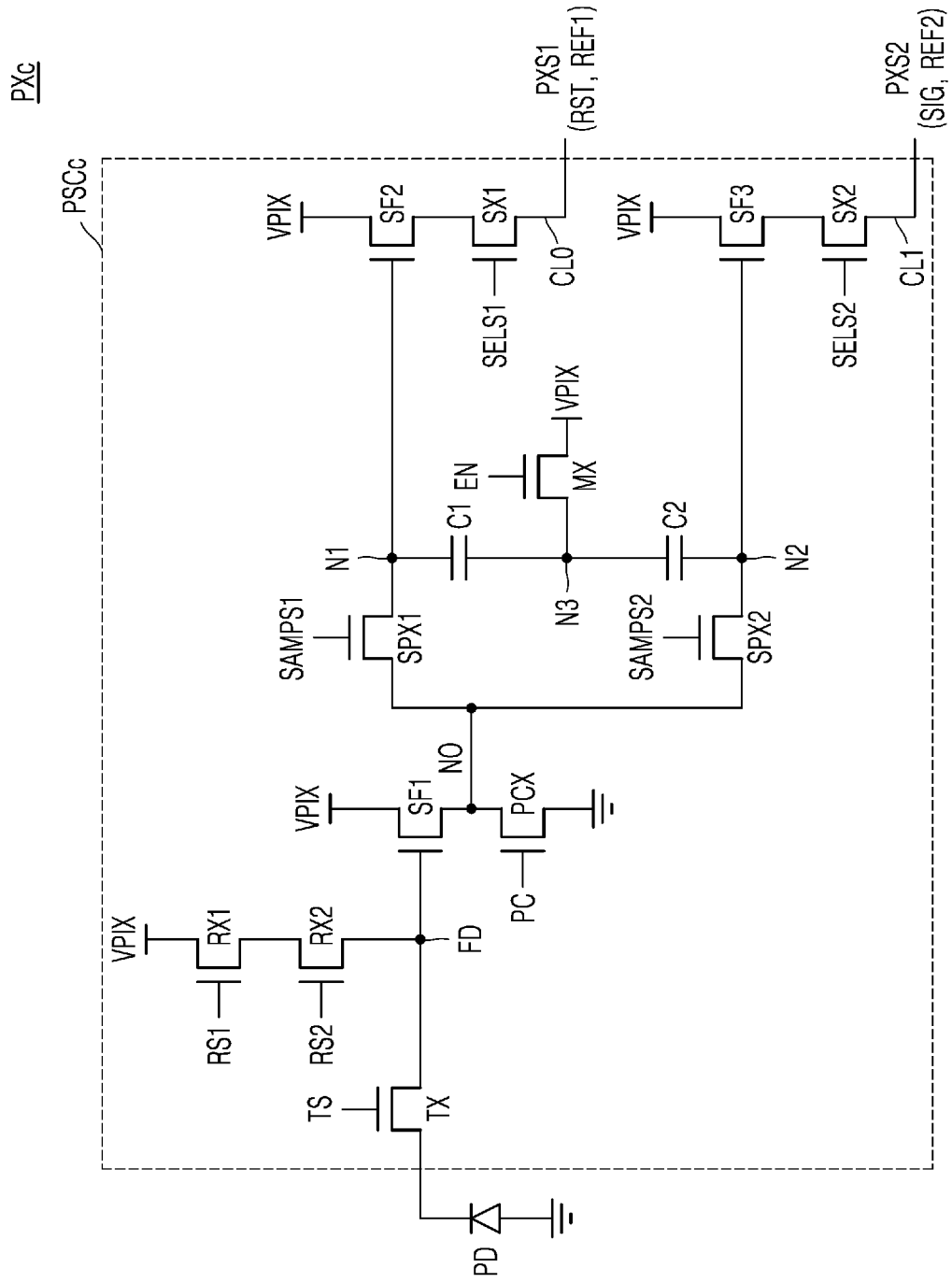
FIG. 10 is a circuit diagram of a pixel included in an image sensor according to an example embodiment.
Figure 11:
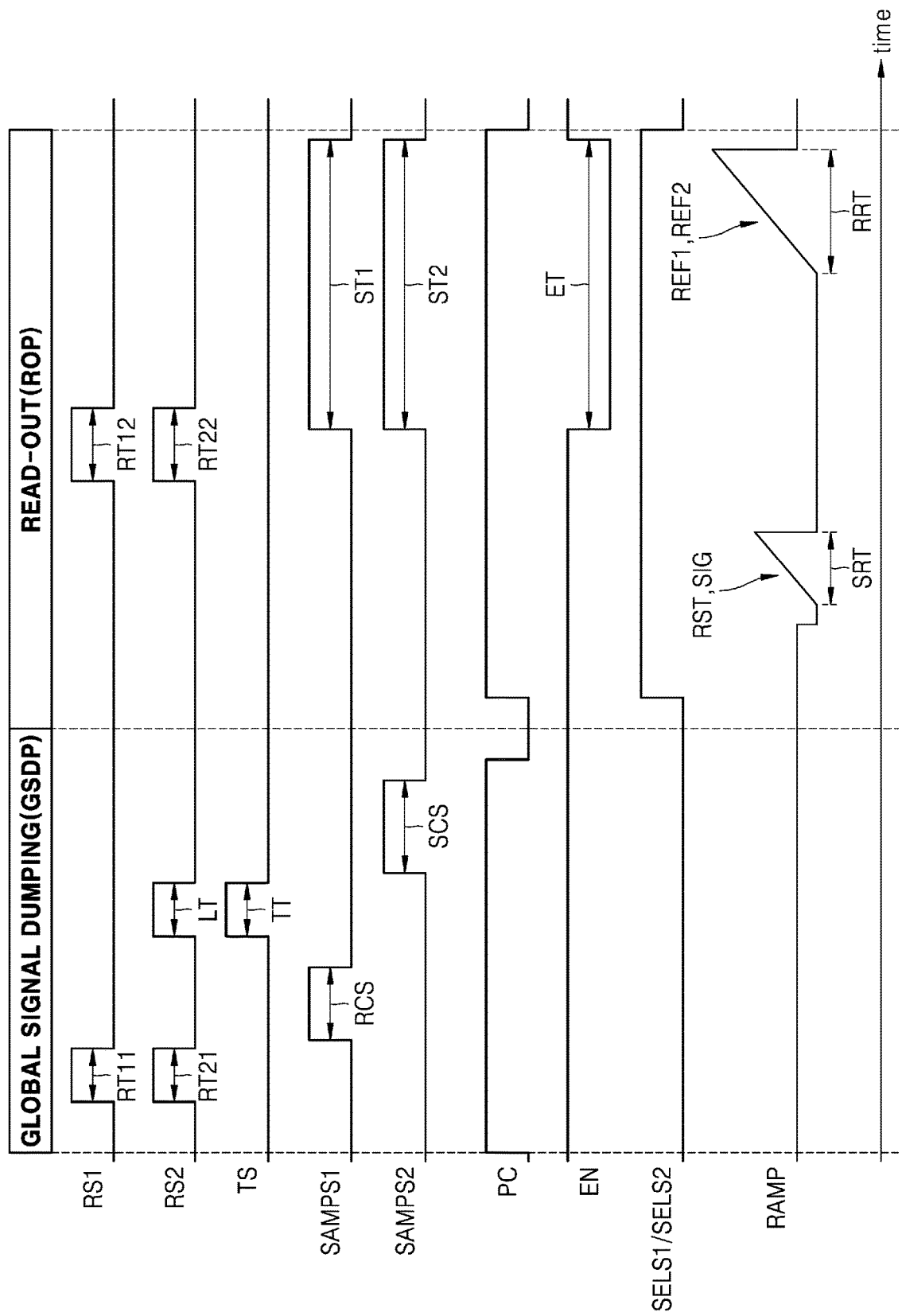
FIG. 11 is a timing diagram illustrating control signals and a ramp signal provided to a pixel of an image sensor according to an example embodiment.

FIG. 10 is a circuit diagram of a pixel PXc included in an image sensor according to an example embodiment. FIG. 11 is a timing diagram illustrating control signals and a ramp signal provided to the pixel PXc of an image sensor according to an example embodiment. In the description of FIG. 10, redundant descriptions given with respect to FIG. 2 will be omitted. In the description of FIG. 11, redundant descriptions given with respect to FIG. 5 will be omitted.

Referring to FIG. 10, the pixel PXc may include the photodiode PD and a pixel signal generation circuit PSCc that generates pixel signals PXS1 and PXS2. The pixel signal generation circuit PSCc may include a plurality of transistors TX, RX1, RX2, SF1, PCX, SPX1, SPX2, MX, SF2, SF3, SX1, and SX2, the first capacitor C1, and the second capacitor C2. The control signals TS, RS1, RS2, PC, SAMPS1, SAMPS2, EN, SELS1, and SELS2 applied to the pixel signal generation circuit PSCc may be some of the control signals CSs generated by the row driver 140.

The pixel signal generation circuit PSCc may include a first reset transistor RX1 and a second reset transistor RX2. The first reset transistor RX1 and the second reset transistor RX2 may reset charges integrated in the floating diffusion node FD. The pixel voltage VPIX may be applied to a first terminal of the reset transistor RX1, and a second terminal of the reset transistor RX1 may be connected to the second reset transistor RX2. A first terminal of the second reset transistor RX2 may be connected to the first reset transistor RX1, and a second terminal of the second reset transistor RX2 may be connected to the floating diffusion node FD.

The first reset transistor RX1 and the second reset transistor RX2 may be respectively turned on or off in response to a first reset control signal RS1 and a second reset control signal RS2 received from the row driver 140. When both the first reset transistor RX1 and the second reset transistor RX2 are turned on, charges integrated in the floating diffusion node FD are discharged and the floating diffusion node FD may be reset.

Referring to FIGS. 10 and 11, during the global signal dumping period GSDP, the first reset control signal RS1 may transition from a second level (e.g., a low level) to a first level (e.g., a high level) to maintain the high level for a first reset time RT11. During the global signal dumping period GSDP, the second reset control signal RS2 may transition from the second level to the first level to maintain the first level for a first reset time RT21. The first reset transistor RX1 and the second reset transistor RX2 may be respectively turned on by the first reset control signal RS1 of the high level and the second reset control signal RS2 of the high level, and the floating diffusion node FD may be reset (a reset operation). In an example embodiment, the first reset time RT11 of the first reset control signal RS1 and the first reset time RT21 of the second reset control signal RS2 may overlap each other, and for example, may coincide with each other.

In an example embodiment, the image sensor may operate in a low conversion gain (LCG) mode and a high conversion gain (HCG) mode to support a dual conversion gain (DCG) function. In the LCG mode, when the transfer control signal TS maintains a high level for the integration time TT, the second reset control signal RS2 may have a high level. The second reset control signal RS2 may maintain a high level for an LCG time LT, and the LCG time LT and the integration time TT may overlap with each other. Because the second reset transistor RX2 is turned on while photocharges are integrated in the floating diffusion node FD, an effect of substantially increasing the equivalent capacitance of the floating diffusion node FD may occur, and a conversion gain for converting the photocharges generated in the photodiode PD into the image signal SIG may be reduced. However, as the equivalent capacitance of the floating diffusion node FD increases, a relatively large amount of photocharges may be integrated in the floating diffusion node FD.

In an example embodiment, an additional capacitor may be further connected to a first terminal of the second reset transistor RX2, and when the second reset transistor RX2 is turned on, the additional capacitor and the floating diffusion node FD are electrically connected to each other and thus, the equivalent capacitance of the floating diffusion node FD may increase.

FIG. 11 is a timing diagram illustrating the image sensor that operates in the LCG mode, but the image sensor according to embodiments of the disclosure is not limited thereto. When the image sensor operates in the HCG mode, the second reset control signal RS2 may maintain the low level for the integration time TT during which the transfer control signal TS maintains the high level. In the HCG mode, the conversion efficiency of converting photocharges generated by the photodiode PD into the image signal SIG may relatively increase, and a relatively small amount of photocharges may be integrated in the floating diffusion node FD.

When the first reset control signal RS1 maintains the high level for the second reset time RT12 during the read-out period ROP, the second reset control signal RS2 may maintain the high level for the second reset time RT22. The first reset transistor RX1 and the second reset transistor RX2 may be turned on by the first reset control signal RS1 of the high level and the second reset control signal RS2 of the high level, and the floating diffusion node FD may be reset. For example, the voltage of the floating diffusion node FD may be reset to the pixel voltage VPIX. In an example embodiment, the second reset time RT12 of the first reset control signal RS1 and the first reset time RT22 of the second reset control signal RS2 may overlap each other, and for example, may coincide with each other.

While example embodiment of the disclosure have been particularly shown and described, it will be understood that various changes in form and details may be made therein without departing from the spirit and scope of the following claims.

What is claimed is:

1. An image sensor comprising:
   a pixel array in which a plurality of pixels are arranged, wherein each pixel of the plurality of pixels comprises:
   a photodiode;
   a floating diffusion node configured to integrate photocharges generated in the photodiode;
   a first sampling transistor electrically connected to a first node;
   a first capacitor electrically connected to the first node and configure to store a charge corresponding to a voltage of the floating diffusion node which is reset;
   a second sampling transistor electrically connected to a second node;
   a second capacitor electrically connected to the second node and configured to store a charge corresponding to a voltage of the floating diffusion node in which the photocharges are integrated; and
   at least one mode transistor configured to adjust an equivalent capacitance of each of the first node and the second node according to a mode control signal.

2. The image sensor of claim 1, wherein each pixel of the plurality of pixels further comprises:
   a first source follower transistor configured to output, to a first column line, a first pixel signal according to a potential change of the first node; and
   a second source follower transistor configured to output, to a second column line, a second pixel signal according to a potential change of the second node.

3. The image sensor of claim 2, further comprising a read-out circuit configured to receive pixel signals, via a plurality of column lines electrically connected to the pixel array, and output image data according to the pixel signals, wherein the read-out circuit comprises:
   a first correlated double sampling (CDS) circuit and a first analog digital circuit (ADC), which are electrically connected to the first column line,;
   a second CDS circuit and a second ADC, which are electrically connected to the second column line; and
   a subtraction circuit configured to subtract a digital signal output from the second ADC from a digital signal output from the first ADC.

4. The image sensor of claim 2, wherein, in a first period, the first source follower transistor is further configured to output, to the first column line, a reset signal corresponding to the voltage of the floating diffusion node which is reset, and the second source follower transistor is further configured to output, to the second column line, an image signal corresponding to the voltage of the floating diffusion node in which the photocharges are integrated, and
   wherein, in a second period after the first period, the first source follower transistor is further configured to output, to the first column line, a first reference signal corresponding to the voltage of the floating diffusion node which is reset, and the second source follower transistor is further configured to output, to the second column line, a second reference signal corresponding to the voltage of the floating diffusion node which is reset.

5. The image sensor of claim 4, wherein the at least one mode transistor is further configured to control the equivalent capacitance of each of the first node and the second node in the first period to be greater than a capacitance of each of the first node and the second node in the second period.

6. The image sensor of claim 4, further comprising a row driver configured to generate the mode control signal such that the at least one mode transistor is turned off in the second period, when the first sampling transistor and the second sampling transistor are turned-on in the second period.

7. The image sensor of claim 1, wherein a first terminal of the at least one mode transistor is electrically connected to a third node, the third node being electrically connected to the first capacitor and the second capacitor, and
   wherein a pixel voltage is applied to a second terminal of the at least one mode transistor.

8. The image sensor of claim 1, wherein the at least one mode transistor comprises a first mode transistor and a second mode transistor,
   wherein a first terminal of the first mode transistor is electrically connected to the first capacitor, and a pixel voltage is applied to a second terminal of the first mode transistor, and
   wherein a first terminal of the second mode transistor is electrically connected to the second capacitor, and the pixel voltage is applied to a second terminal of the second mode transistor.

9. The image sensor of claim 1, wherein the at least one mode transistor comprises a first mode transistor and a second mode transistor,
   wherein a first terminal of the first mode transistor is electrically connected to the first node, and a second terminal of the first mode transistor is electrically connected to the first capacitor, and
   wherein a first terminal of the second mode transistor is electrically connected to the second node, and a second terminal of the second mode transistor is electrically connected to the second capacitor.

10. The image sensor of claim 1, wherein each pixel of the plurality of pixels further comprises a first reset transistor and a second reset transistor electrically connected to each other in series, the first reset transistor and the second reset transistor being configured to reset the floating diffusion node to a pixel voltage.

11. The image sensor of claim 10, wherein the floating diffusion node is further configured to integrate the photocharges based on the first reset transistor being turned off and the second reset transistor being turned on.

12. An image sensor comprising:
a pixel array in which a plurality of pixels are arranged, wherein each pixel of the plurality of pixels comprises:
a photodiode;
a floating diffusion node configured to integrate photocharges generated in the photodiode;
a first reset transistor configured to reset the floating diffusion node to a pixel voltage;
a first source follower transistor configured to amplify a potential change of the floating diffusion node and output the amplified potential change to an output node;
a first sampling transistor electrically connected between the output node and a first node;
a second sampling transistor electrically connected between the output node and a second node, the second node being different from the first node;
a first capacitor electrically connected between the first node and a third node;
a second capacitor electrically connected between the second node and the third node; and
at least one mode transistor configured to provide the pixel voltage to a first terminal of the first capacitor and a first terminal of the second capacitor based on a mode control signal.

13. The image sensor of claim 12, wherein each pixel of the plurality of pixels further comprises:
a second source follower transistor configured to output, to a first column line, a first pixel signal according to a potential change of the first node; and
a third source follower transistor configured to output, to a second column line, a second pixel signal according to a potential change of the second node.

14. The image sensor of claim 13, wherein, in a first period, the second source follower transistor is further configured to output, to the first column line, a reset signal corresponding to a voltage of the floating diffusion node which is reset, and the third source follower transistor is further configured to output, to the second column line, an image signal corresponding to a voltage of the floating diffusion node in which the photocharges are integrated, and
wherein, in a second period after the first period, the second source follower transistor is further configured to output, to the first column line, a first reference signal corresponding to the voltage of the floating diffusion node which is reset, and the third source follower transistor is further configured to output, to the second column line, a second reference signal corresponding to the voltage of the floating diffusion node which is reset.

15. The image sensor of claim 12, wherein each pixel of the plurality of pixels further comprises:
a precharge transistor configured to precharge the output node.

16. The image sensor of claim 12, wherein the at least one mode transistor is configured to apply the pixel voltage to the third node according to the mode control signal.

17. The image sensor of claim 12, wherein the at least one mode transistor comprises a first mode transistor and a second mode transistor,
wherein the first mode transistor is electrically connected between the third node, to which the pixel voltage is applied, and the first capacitor, and
wherein the second mode transistor is electrically connected between the third node, to which the pixel voltage is applied, and the second capacitor.

18. The image sensor of claim 12, wherein each pixel of the plurality of pixels further comprises a second reset transistor electrically connected between the floating diffusion node and the first reset transistor,
wherein the second reset transistor is configured to adjust an equivalent capacitance of the floating diffusion node.

19. The image sensor of claim 12, wherein the first capacitor is configured to store charges corresponding to a voltage of the floating diffusion node which is reset, and
wherein the second capacitor is configured to store charges corresponding to the voltage of the floating diffusion node in which the photocharges are integrated.

20. An image sensor comprising:
a pixel array in which a plurality of pixels are arranged, wherein each pixel of the plurality of pixels comprises:
a photodiode;
a transfer transistor configured to transmit photocharges generated in the photodiode to a floating diffusion node;
a reset transistor configured to reset the floating diffusion node to a pixel voltage;
a first source follower transistor configured to amplify a potential change of the floating diffusion node and output the amplified potential change to an output node;
a precharge transistor configured to precharge the output node;
a first sampling transistor electrically connected between the output node and a first node;
a second sampling transistor electrically connected between the output node and a second node, the second node being different from the first node;
a first capacitor electrically connected between the first node and a third node;
a second capacitor electrically connected between the second node and the third node;
a mode transistor configured to apply the pixel voltage to the third node according to a switching operation of the mode transistor;
a second source follower transistor configured to amplify and output a potential change of the first node;
a first selection transistor electrically connected to the second source follower transistor and configured to output a first pixel signal to a first column line;
a third source follower transistor configured to amplify and output a potential change of the second node; and
a second selection transistor electrically connected to the third source follower transistor and configured to output a second pixel signal to a second column line.

* * * * *